US012604781B2

(12) United States Patent (10) Patent No.: US 12,604,781 B2
Tsai et al. (45) Date of Patent: Apr. 14, 2026

(54) PACKAGE STRUCTURE INCLUDING GUIDING PATTERNS

(71) Applicant: Taiwan Semiconductor Manufacturing Company, Ltd., Hsinchu (TW)

(72) Inventors: Chen-Hsuan Tsai, Taitung (TW); Chin-Chuan Chang, Hsinchu County (TW); Ying-Ching Shih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 375 days.

(21) Appl. No.: 18/324,989

(22) Filed: May 28, 2023

(65) Prior Publication Data

US 2024/0395772 A1 Nov. 28, 2024

(51) Int. Cl.
*H01L 25/065* (2023.01)
*H01L 23/00* (2006.01)
*H01L 23/31* (2006.01)
*H01L 23/40* (2006.01)
*H01L 23/498* (2006.01)
*H01L 23/538* (2006.01)
*H10D 64/01* (2025.01)

(52) U.S. Cl.
CPC ...... *H01L 25/0655* (2013.01); *H01L 23/3128* (2013.01); *H01L 23/4006* (2013.01); *H01L 23/49816* (2013.01); *H01L 23/5385* (2013.01); *H01L 24/16* (2013.01); *H10D 64/017* (2025.01); *H01L 2023/4087* (2013.01); *H01L 2924/15311* (2013.01)

(58) Field of Classification Search
CPC ............. H01L 25/0655; H01L 23/3128; H01L 23/4006
See application file for complete search history.

(56) References Cited

U.S. PATENT DOCUMENTS

2018/0211929 A1* 7/2018 Bae ..................... H01L 25/0655
2021/0327778 A1 10/2021 Yu et al.
2022/0157777 A1* 5/2022 Yang ..................... H01L 23/562
2022/0173044 A1 6/2022 Jee et al.

FOREIGN PATENT DOCUMENTS

| TW | 201824462 | 7/2018 |
| TW | 202103281 | 1/2021 |
| TW | 202107644 | 2/2021 |
| TW | 202209589 | 3/2022 |
| TW | 202211421 | 3/2022 |
| TW | 202245209 | 11/2022 |

OTHER PUBLICATIONS

"Office Action of Taiwan Counterpart Application", issued on Feb. 15, 2024, p. 1-p. 8.

* cited by examiner

*Primary Examiner* — Errol V Fernandes

(74) *Attorney, Agent, or Firm* — JCIPRNET

(57) ABSTRACT

A package structure including a wiring substrate, semiconductor dies, and a dielectric layer is provided. The wiring substrate includes die bonding regions and guiding patterns (auxiliary patterns, or dummy patterns) distributed between the die bonding regions. The semiconductor dies are disposed on the die bonding regions and electrically connected to the wiring substrate, wherein the guiding patterns are electrically insulated from the semiconductor dies. The dielectric layer is disposed the semiconductor dies and the wiring substrate, wherein the dielectric layer covers and is in contact with the guiding patterns.

20 Claims, 16 Drawing Sheets

PACKAGE STRUCTURE INCLUDING GUIDING PATTERNS

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
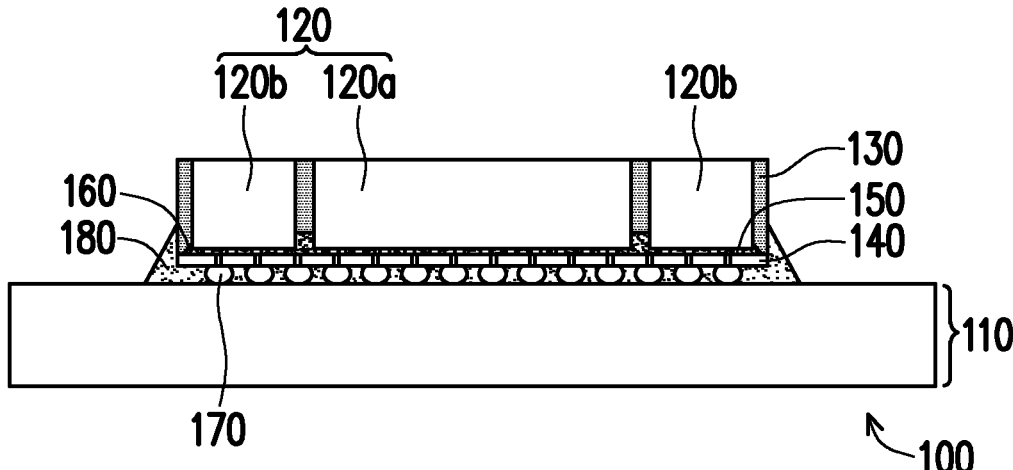
FIG. 1 through FIG. 4 are cross-sectional views schematically illustrating a process flow for fabricating a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 4 are cross-sectional views schematically illustrating a process flow for fabricating a semiconductor device in accordance with some embodiments of the present disclosure.

Referring to FIG. 1, a package structure 100 including a packaging substrate 110, semiconductor dies 120 and an insulating encapsulation 130 is provided. The semiconductor dies 120 are disposed on and electrically connected to the packaging substrate 110, and the insulating encapsulation 130 laterally encapsulates the semiconductor dies 120. In some embodiments, as illustrated in FIG. 1, a Chip-on-Wafer-on-Substrate (CoWoS) package structure 100 is provided. The CoWoS package structure 100 may include a packaging substrate 110, semiconductor dies 120, an insulating encapsulation 130, an interposer wiring substrate 140, conductive terminals 150, a dielectric layer 160, conductive terminals 170 and a dielectric layer 180. In some embodiments, the interposer wiring substrate 140 includes a silicon interposer, an organic interposer or other suitable interposer substrate. The interposer wiring substrate 140 may include conductive wirings formed thereon. The interposer wiring substrate 140 may include conductive through vias formed therein.

The packaging substrate 110 may be a printed circuit board or other suitable types of wiring substrate. The semiconductor dies 120 may be or include at least one first semiconductor die 120a and at least one second semiconductor die 120b. The at least one first semiconductor die 120a and the at least one second semiconductor die 120b are disposed on the interposer wiring substrate 140 in side-by-side manner. In some embodiments, the first semiconductor die 120a includes a High-Bandwidth-Memory (HBM) cube including stacked HBM memory dies and controller die for controlling the operation of the stacked HBM memory dies, and the second semiconductor die 120b includes a System-on-Chip (SoC) die. In some other embodiments, the first semiconductor die 120a and the second semiconductor die 120b may be System on Integrated Circuit (SoIC) dies with various functions. The first semiconductor die 120a and the second semiconductor die 120b are disposed on the interposer wiring substrate 140 and electrically connected to the interposer wiring substrate 140 through the conductive terminals 150. The semiconductor dies 120 are bonded with the interposer wiring substrate 140 through the conductive terminals 150 by a Chip-on-Wafer (CoW) bonding process. The conductive terminals 150 are disposed between the semiconductor dies 120 and the interposer wiring substrate 140. The conductive terminals 150 may be or include micro-bumps for electrically connecting the semiconductor dies 120 and the interposer wiring substrate 140. The dielectric layer 160 is disposed on the interposer wiring substrate 140. The dielectric layer 160 is disposed between the semiconductor dies 120 and the interposer wiring substrate 140 to laterally encapsulate the conductive terminals 150. In some embodiments, the dielectric layer 160 includes underfill material, molding compound, polymer, oxide materials, nitride materials or combinations thereof. Accordingly, shearing stress suffered by the conductive terminals 150 may be minimized by the dielectric layer 160, and the reliability of the conductive terminals 150 may be enhanced by the dielectric layer 160. The material of the dielectric layer 160 may be or include epoxy resin or other suitable dielectric materials.

The detailed descriptions related to the formation of the dielectric layer 160 will be described in accompany with FIG. 5A through FIG. 5E.

As illustrated in FIG. 1, the insulating encapsulation 130 is disposed on the interposer wiring substrate 140 to laterally encapsulate the semiconductor dies 120 and the dielectric layer 160. The insulating encapsulation 130 is not in contact with the foot portion 124 of the lid 210. As illustrated in FIG. 1, the top surfaces (e.g., the back surfaces) of the semiconductor dies 120 are substantially level with the top surface of the insulating encapsulation 130, and the sidewalls of the insulating encapsulation 130 are substantially aligned with the sidewalls of the interposer wiring substrate 140. The conductive terminals 170 are disposed on the bottom surface of the interposer wiring substrate 140, and the interposer wiring substrate 140 is electrically connected to the packaging substrate 110 through the conductive terminals 170. The conductive terminals 170 may be or include Controlled Collapse Chip Connection bumps (C4 bumps) for electrically connecting the interposer wiring substrate 140 and the packaging substrate 110. The dielectric layer 180 is disposed on the packaging substrate 110. The dielectric layer 180 is disposed between the interposer wiring substrate 140 and the packaging substrate 110 to laterally encapsulate the conductive terminals 170. In some embodiments, the dielectric layer 180 includes underfill material, molding compound, polymer, oxide materials, nitride materials or combinations thereof. Furthermore, the dielectric layer 180 covers sidewalls of the interposer wiring substrate 140 as well as lower portions of sidewalls of insulating encapsulation 130.

As illustrated in FIG. 1, the semiconductor dies 120 are electrically connected to the packaging substrate 110 through the interposer wiring substrate 140, the conductive terminals 150 and the conductive terminals 170. The interposer wiring substrate 140 may be a silicon interposer wiring substrate with fine line pitch (e.g., sub-um pitch), an organic interposer wiring substrate with less aggressive fine line pitch (e.g., 4 um pitch) or an interposer wiring substrate with Local Silicon Interconnect (LSI) die. In an embodiment where the interposer wiring substrate 140 is a silicon interposer wiring substrate, the CoWoS package structure 100 is so-called a CoWoS-S package. In an embodiment where the interposer wiring substrate 140 is an organic interposer wiring substrate, the CoWoS package structure 100 is so-called a CoWoS-R package. In an embodiment where the interposer wiring substrate 140 is an interposer wiring substrate with Local Silicon Interconnect (LSI) die, the CoWoS package structure 100 is so-called a CoWoS-L package.

Although an CoWoS package structure 100 is shown in FIG. 1 for illustration, the configuration of the package structure 100 is not limited to CoWoS package, an integrated fanout assembly-on-Substrate (InFO-Os) package may be utilized in embodiments of the present invention.

Figure 2:
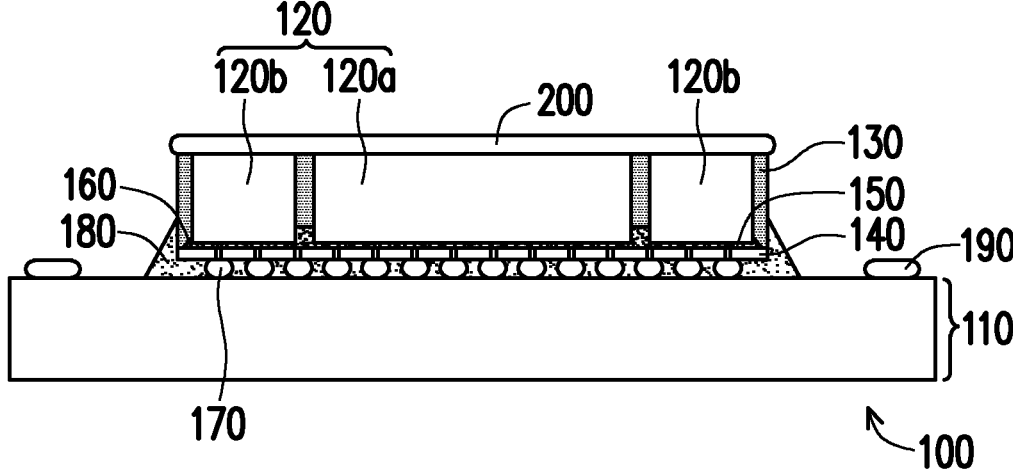

Referring to FIG. 2, an adhesive 190 is applied on the packaging substrate 110, and a thermal interface material (TIM) 200 is applied on the top surfaces (e.g., the back surfaces) of the semiconductor dies 120 and the top surface of the insulating encapsulation 130. The material of the adhesive 190 may be or include thermally conductive adhesive, silicone based adhesive or epoxy resin-based adhesive. The material of the adhesive may be or include rubber based having curing promoting material. The thermal interface material 200 may be or include silicone-based thermal interface material, metallic thermal interface material, combinations thereof or the like. In the present embodiments, a film-type thermal interface material 200 is provided and attached on the top surfaces (e.g., the back surfaces) of the semiconductor dies 120 and the top surface of the insulating encapsulation 130.

Figure 3:
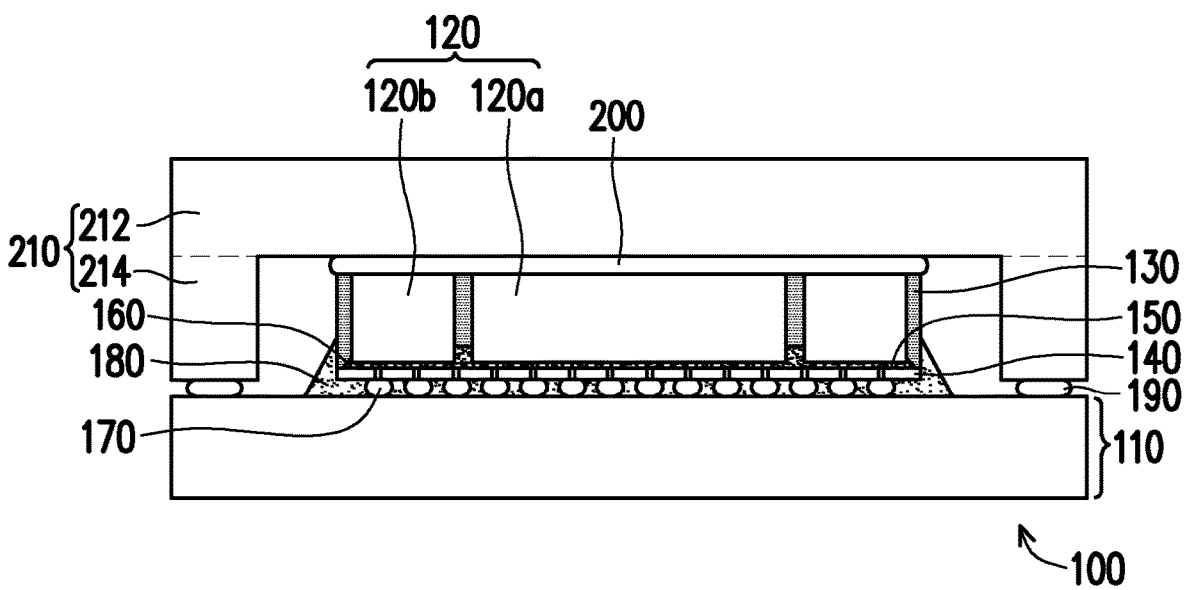

Referring to FIG. 3, after the adhesive 190 and the thermal interface material 200 are applied, a lid 210 is provided and attached onto the CoWoS package structure 100. The lid 210 is mounted onto the packaging substrate 110 to cover the semiconductor dies 120 encapsulated by the insulating encapsulation 130. The lid 210 includes a cover portion 212 and a foot portion 214 extending from the cover portion 212 to the packaging substrate 110. The cover portion 212 covers the semiconductor dies 120 and the insulating encapsulation 130. The bottom surface of the foot portion 214 is attached to the packaging substrate 110 through the adhesive 190, and the cover portion 212 of the lid 210 is attached to the package structure 100 through the thermal interface material 200. The lid 210 may further include an alignment notch 216 formed at a corner of the lid 10 such that the lid 210 may be assembled with the packaging substrate 110 correctly and rapidly. The details of the lid 210 are described in accompany with FIG. 5 and FIG. 6.

Figure 4:
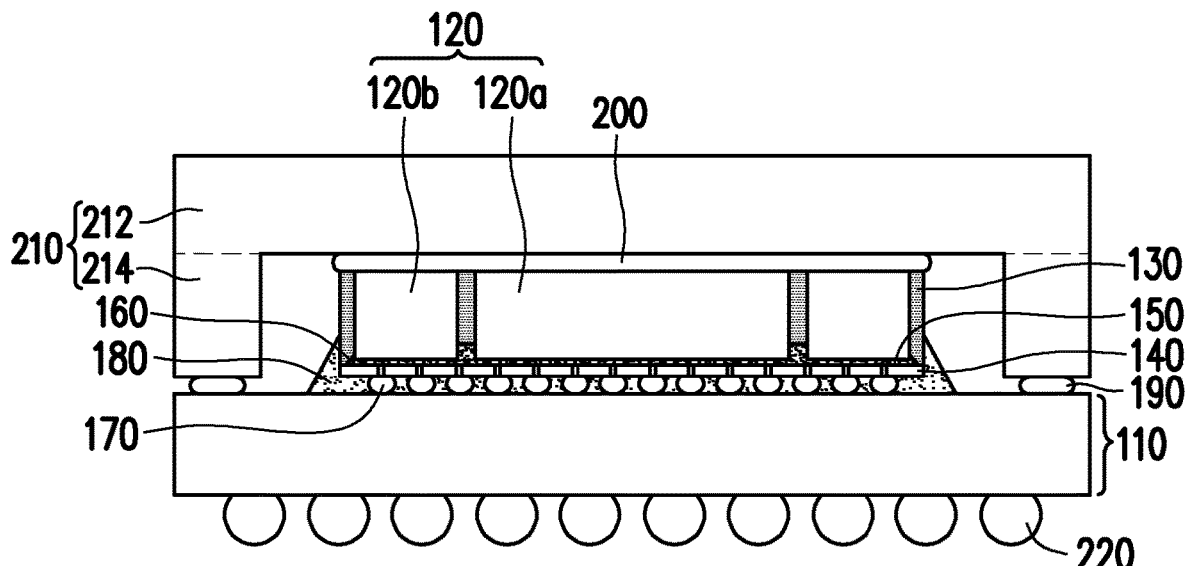

Referring to FIG. 4, conductive terminals 220 are formed on the bottom surface of the packaging substrate 110. The conductive terminals 112 formed on the bottom surface of the packaging substrate 110 may be solder balls arranged in array, and the solder balls may be formed by, for example, a ball mount process following by a reflowing process. The packaging substrate 110 may be a ball grid array (BGA) circuit board. After the conductive terminals 220 are formed on the bottom surface of the packaging substrate 110, a singulation process may be performed to cut the packaging substrate 110 to obtain singulated semiconductor devices as shown in FIG. 4.

FIG. 5A through FIG. 5E schematically illustrate a process flow for fabricating the dielectric layer 160 over the interposer wiring substrate 140 of the CoWoS package structure 100.

Figure 5A:
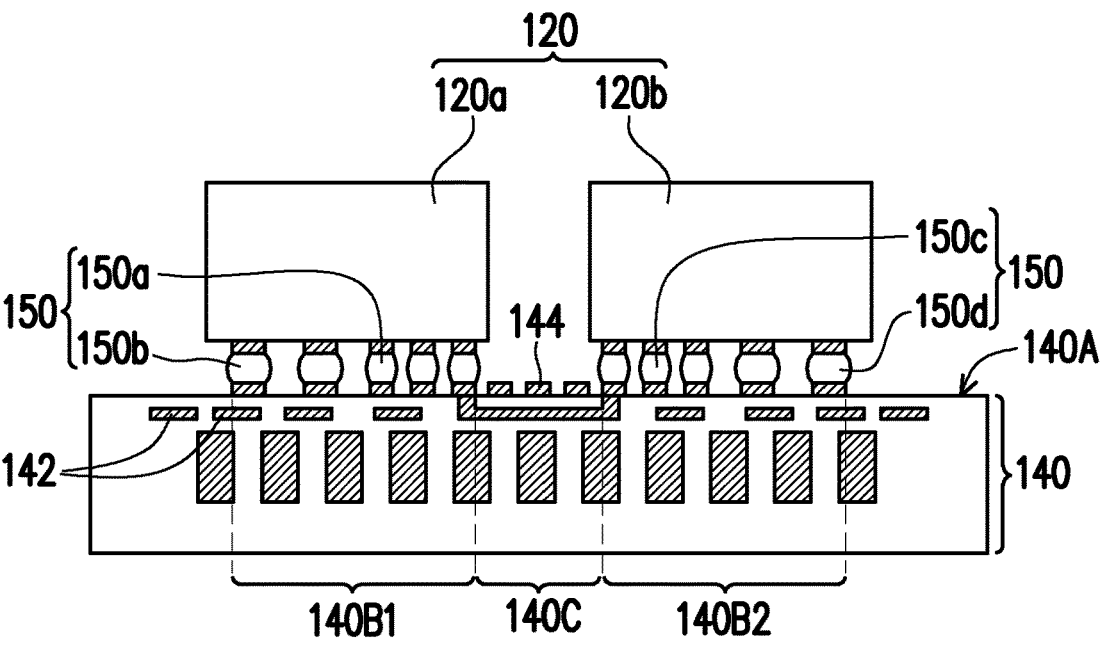
FIG. 5A through FIG. 5E schematically illustrate a process flow for fabricating a dielectric layer over an interposer wiring substrate of a CoWoS package structure in accordance with some embodiments of the present disclosure.
Figure 5A:
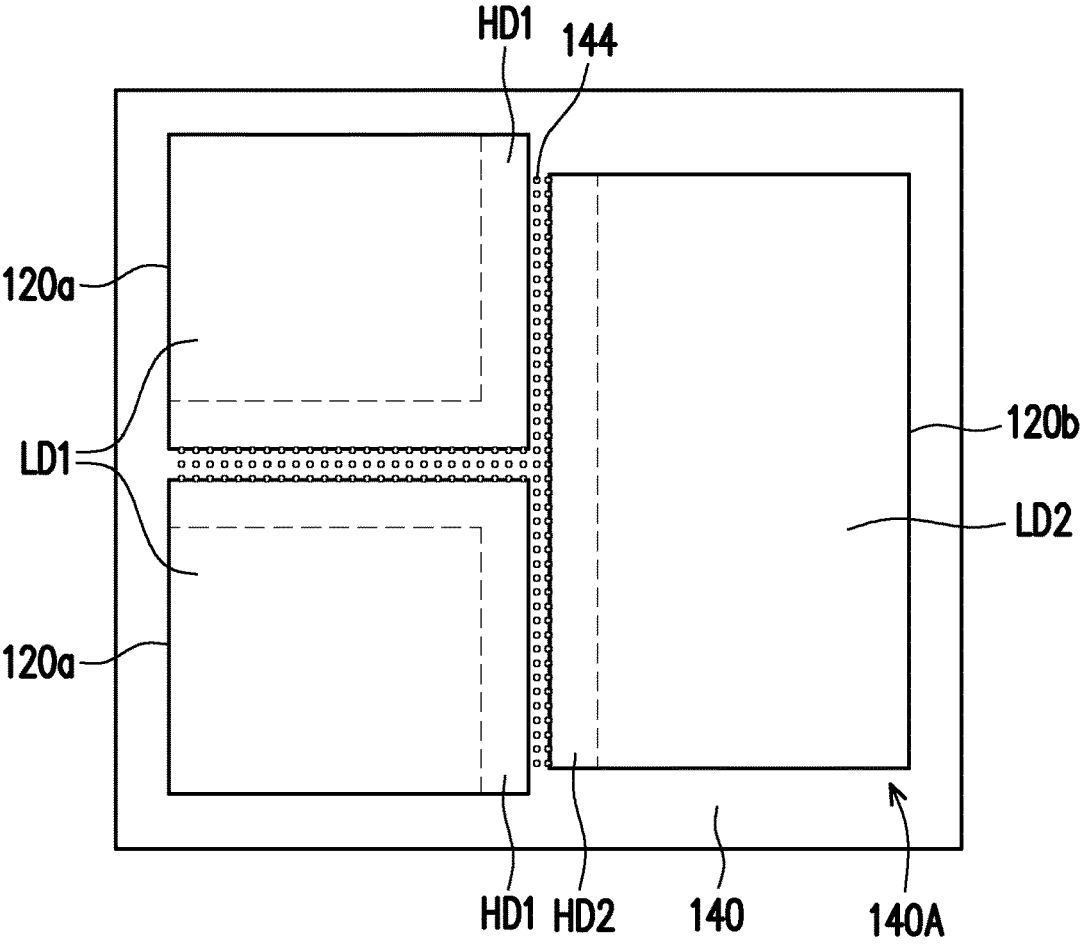

Referring to FIG. 5A, the upper part of FIG. 5A is an enlarged cross-sectional view schematically illustrating the semiconductor dies 120, the interposer wiring substrate 140, and the conductive terminals 150; and the lower part of FIG. 5A is a top view schematically illustrating the distribution of the dummy patterns 144 formed on the interposer wiring substrate 140.

As illustrated in the upper part of FIG. 5A, the interposer wiring substrate 140 may include conductive wirings 142 and guiding patterns 144. The conductive wirings 142 are embedded in the interposer wiring substrate 140 and/or distributed on the top surface 140A of the interposer wiring substrate 140 such that the interposer wiring substrate 140 can provide signal transmission function. Furthermore, the guiding patterns 144 are distributed on the top surface 140A of the interposer wiring substrate 140 to provide guiding function. In other words, the guiding patterns 144 may be dummy patterns or auxiliary patterns for guiding or adjusting the flow (e.g., flow speed, flow direction, flow front or combination thereof) of the subsequently applied underfill material (shown in FIG. 5D).

In some embodiments, the interposer wiring substrate 140 includes a first die bonding region 140B1 and a second die bonding region 140B2 laterally spaced apart from the first die bonding region 140B1. The first die bonding region 140B1 is laterally spaced apart from the second die bonding region 140B2 by a separation region 140C. The separation region 140C is distributed laterally between the first die bonding region 140B1 and the second die bonding region 140B2. Both the first semiconductor die 120a and the second semiconductor die 120b are mounted on the top surface 140A of the interposer wiring substrate 140. The first semiconductor die 120a and the second semiconductor die 120b are electrically connected to the conductive wirings 142 of the interposer wiring substrate 140. The first semiconductor die 120a may be mounted on the first die bonding region 140B1 and electrically connected to the interposer wiring substrate 140 through a first group of conductive terminals 150a and a second groups of conductive terminals 150b, and the second semiconductor die 120b may be mounted on the second die bonding region 140B2 and electrically connected to the interposer wiring substrate 140 through a third group of conductive terminals 150c and a fourth groups of conductive terminals 150d. The above-mentioned groups of conductive terminals 150a, 150b, 150c and 150d are collectively referred as conductive terminals 150 (e.g., micro-bumps).

The first group of conductive terminals 150a are distributed on high-density areas HD1 of the first die bonding regions 140B1, and the second group of conductive terminals 150b are distributed on a low-density area LD1 of the first die bonding region 140B1. The third group of conductive terminals 150c are distributed on a high-density area HD2 of the second die bonding region 140B2, and the fourth group of conductive terminals 150d are distributed on a low-density area LD2 of the second die bonding region 140B2. As illustrated in the lower part of FIG. 5A, the separation region 140C is defined by the high-density areas HD1 and the high-density area HD2. As illustrated in the lower part of FIG. 5A, the separation region 140C is a T-shaped region defined by two L-shaped high-density areas HD1 and one strip-shaped high-density area HD2. However, the separation region 140C is not limited to be a T-shaped region.

In some embodiments, a first arrangement pitch of the first group of conductive terminals 150a is smaller than a second arrangement pitch of the second group of conductive terminals 150b, and a third arrangement pitch of the third group of conductive terminals 150c is smaller than a fourth arrangement pitch of the fourth group of conductive terminals 150d. The first arrangement pitch may equal to the third arrangement pitch, and the second arrangement pitch may equal to the fourth arrangement pitch. In some other embodiment, the first arrangement pitch is different from the third arrangement pitch, and the second arrangement pitch is different from the fourth arrangement pitch.

As illustrated in FIG. 5A, the guiding patterns 144 are distributed in the separation region 140C between the first die bonding region 140B1 and the second die bonding region 140B2. The guiding patterns 144 of the interposer wiring substrate 140 are electrically floating. The guiding patterns 144 of the interposer wiring substrate 140 are electrically insulated from the conductive wirings 142 of the interposer wiring substrate 140. The guiding patterns 144 of the interposer wiring substrate 140 are electrically insulated from the first semiconductor die 120a and the second semiconductor die 120b. The guiding patterns 144 of the interposer wiring substrate 140 are electrically insulated from the first group of conductive terminals 150a, the second group of conductive terminals 150b, the third group of conductive terminals 150c, and the fourth group of conductive terminals 150d. Furthermore, the first group of conductive terminals 150a are laterally disposed between the guiding patterns 144 and the second group of conductive terminals 150b, and the third group of conductive terminals 150c are laterally disposed between the guiding patterns 144 and the fourth group of conductive terminals 150d.

After the first semiconductor die 120a and the second semiconductor die 120b are mounted onto the top surface of the interposer wiring substrate 140, a first gap is maintained between the first semiconductor die 120a and the interposer wiring substrate 140, and a second gap is maintained between the second semiconductor die 120b and the interposer wiring substrate 140. The guiding patterns 144 of the interposer wiring substrate 140 are spaced apart from the first semiconductor die 120a and the second semiconductor die 120b. In other words, the guiding patterns 144 of the interposer wiring substrate 140 are not in physical contact with the first semiconductor die 120a and the second semiconductor die 120b.

Figure 5B:
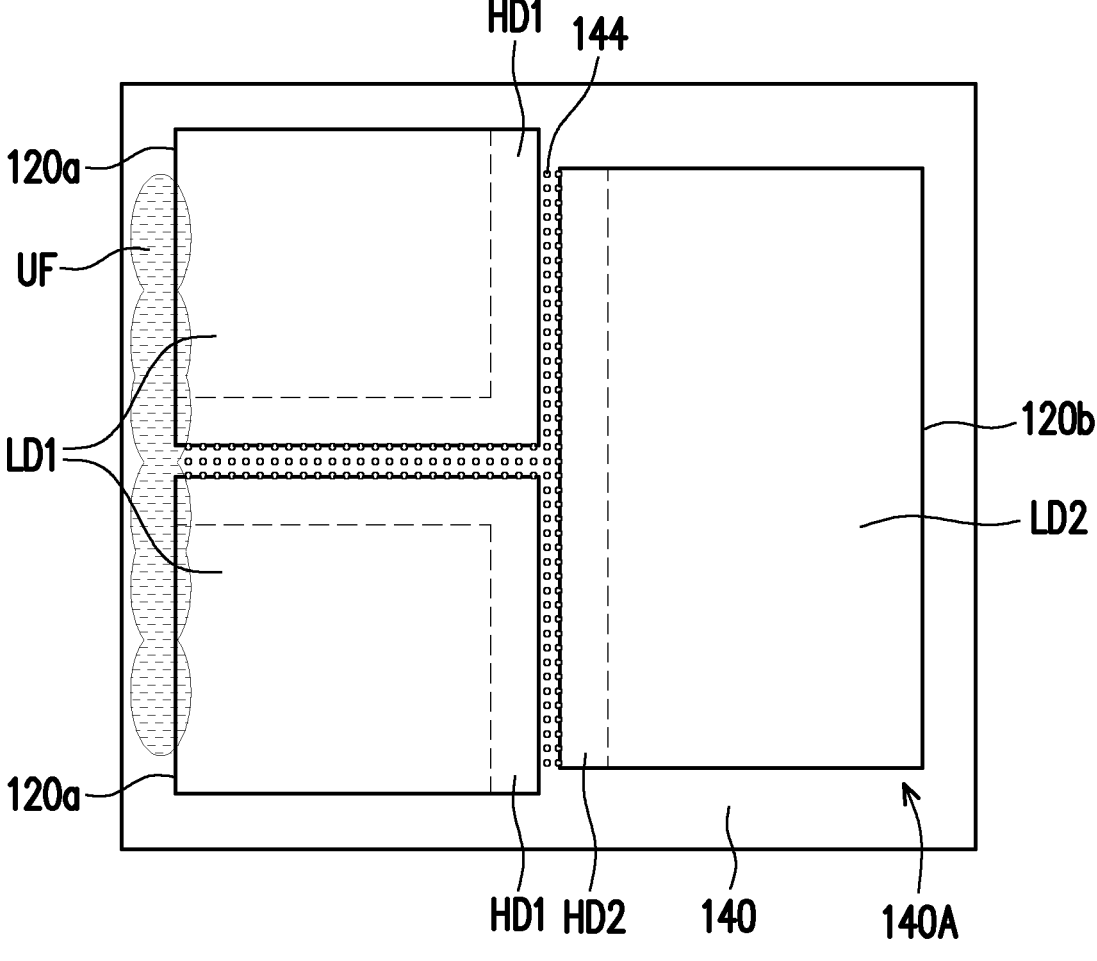
Figure 5C:
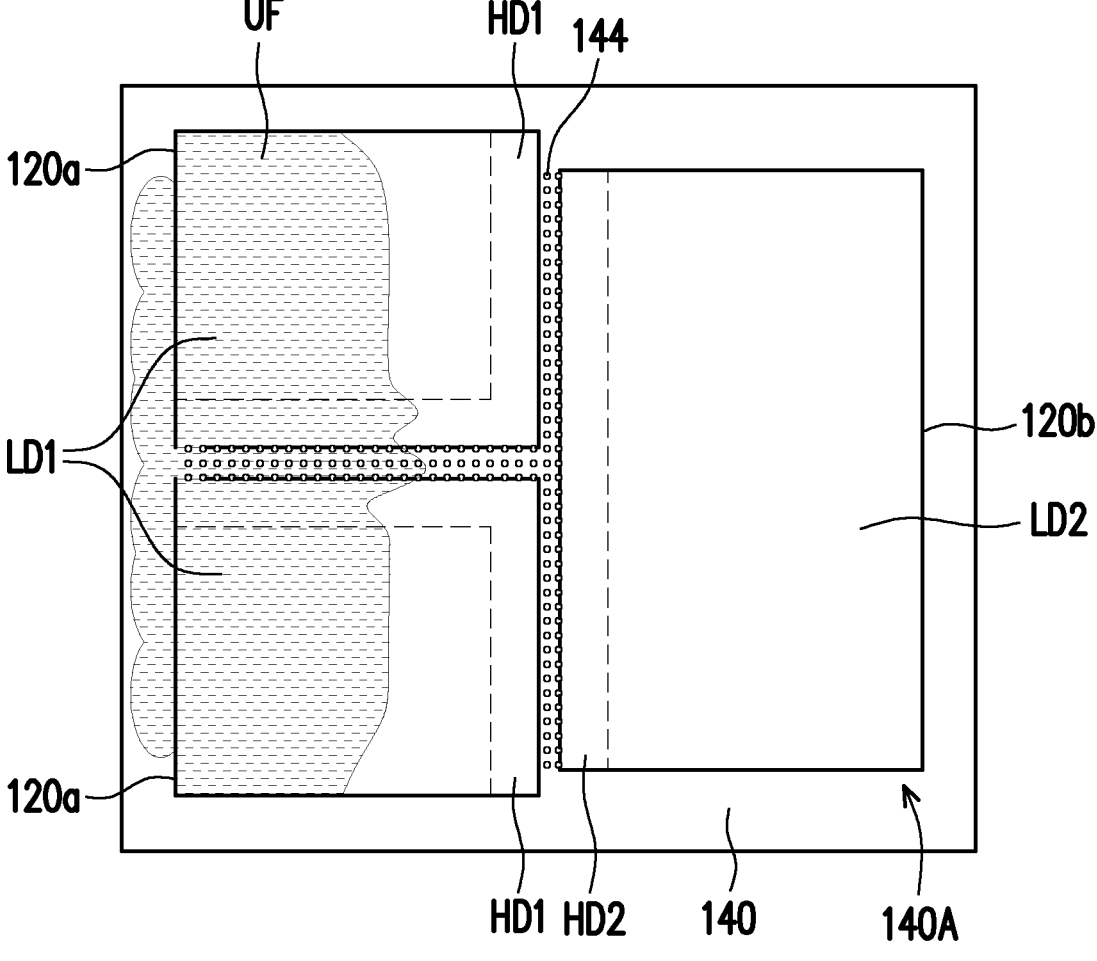
Figure 5D:
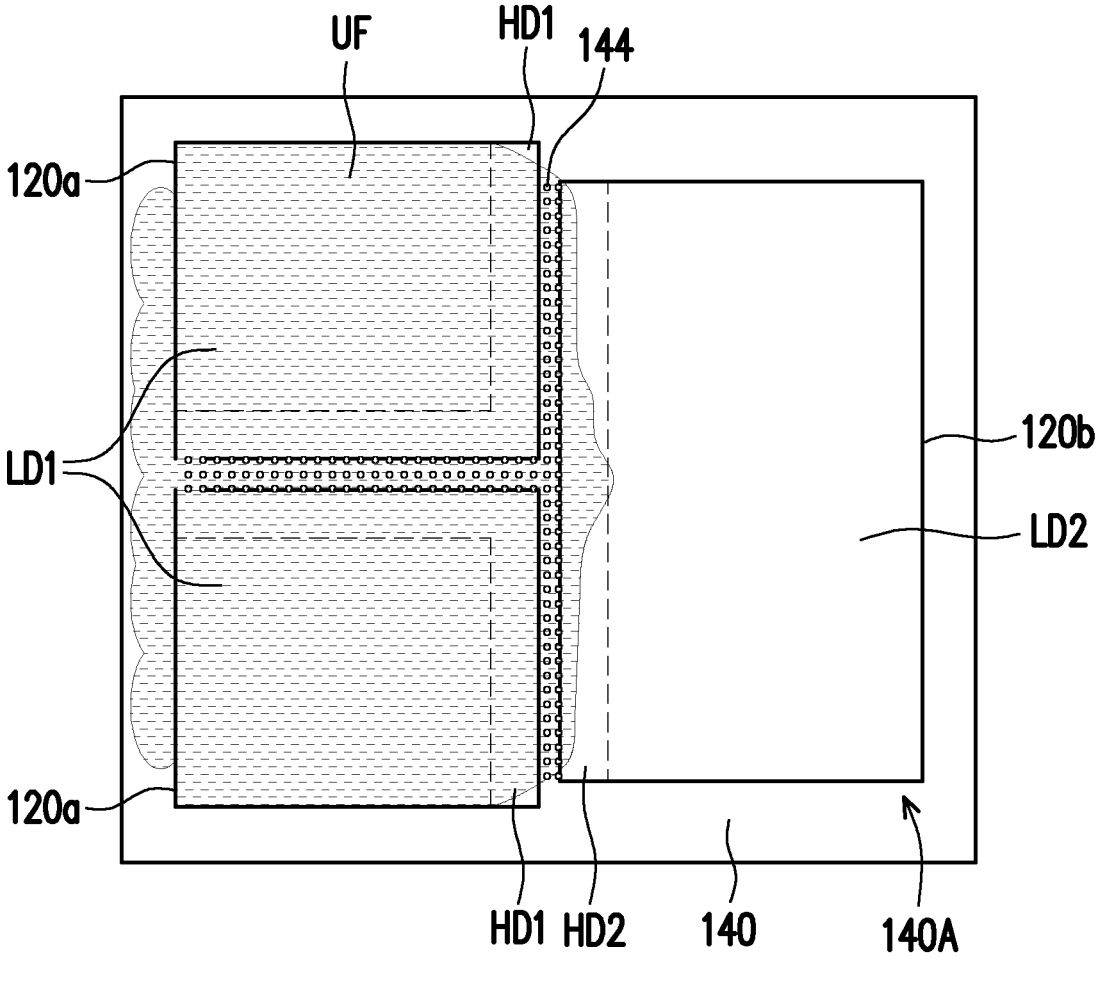
Figure 5E:
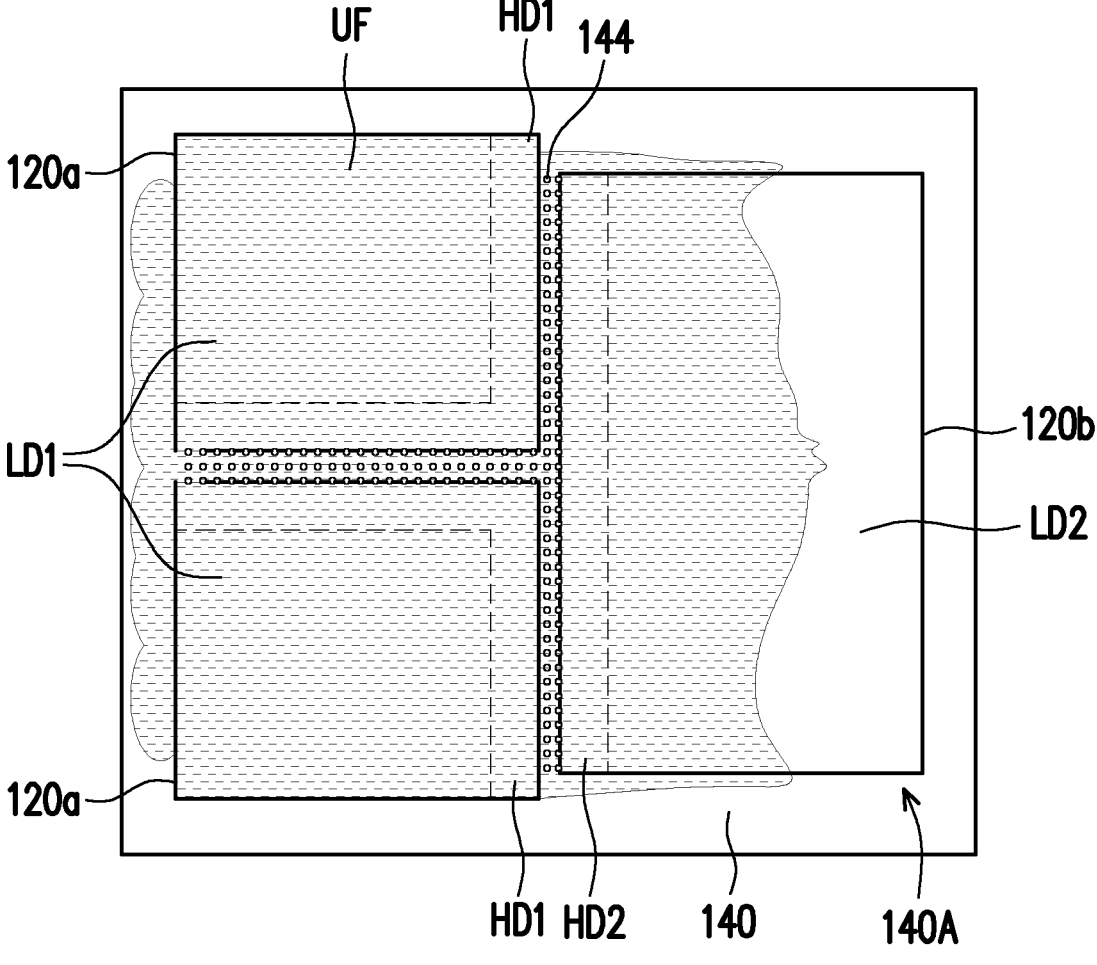

Referring to FIG. 5B through FIG. 5E, after the first semiconductor die 120a and the second semiconductor die 120b are mounted onto the top surface of the interposer wiring substrate 140, a dielectric material such as an underfill material UF is applied onto the top surface 140A of the interposer wiring substrate 140, as illustrated in FIG. 5B. The underfill material UF may be applied at an edge (e.g., the left edge) of the interposer wiring substrate 140 through a capillary underfill process performed by, for example, a dispensing injector. A void-free flowable underfill material UF may be injected by a dispensing injector. Through the capillary, as illustrated in FIG. 5C, the void-free flowable underfill material UF may laterally flow into the first gap between the first semiconductor die 120a and the interposer wiring substrate 140. Then, as illustrated in FIG. 5D and FIG. 5E, the underfill material UF may flow into a region between the first semiconductor die 120a and the interposer wiring substrate 140, pass through the separation region 140C, and then flow into a region between the second semiconductor die 120b and the interposer wiring substrate 140. After performing the dispensing of the underfill material UF, a curing process may be performed such that a dielectric layer 160 as illustrated in FIG. 1 is formed, wherein the dielectric layer 160 covers the guiding patterns 144 and is in physical contact with the guiding patterns 144. Furthermore, the dielectric layer 160 is disposed between the first semiconductor die 120a and the interposer wiring substrate 140 as well as the second gap between the second semiconductor die 120b and the interposer wiring substrate 140.

Since the arrangement pitch of the first groups of conductive terminals 150a is smaller than the arrangement pitch of the second groups of conductive terminals 150b, portions of the underfill material UF which flow over the high-density areas HD1 may move slower (i.e., lower flow speed) than other portions of the underfill material UF which flow over the low-density areas LD1. In other words, the first groups of conductive terminals 150a distributed on the high-density areas HD1 provide less flow resistance when the underfill material UF flows over the high-density areas HD1, and the second groups of conductive terminals 150b distributed on the high-density areas HD1 provide more flow resistance when the underfill material UF flows over the low-density areas LD1. The difference between the above-mentioned flow resistance and the flow speed resulted from the high-density areas HD1 and the low-density areas LD1 may cause voids trapped in the underfill material UF. To improve the encysted void issue of the underfill material UF, the guiding pattern 144 distributed in the separation region 140C (e.g., the T-shaped separation region) are provided. Since the guiding patterns 144 provide sufficient capillary guiding force for the underfill material UF, the guiding patterns 144 reduce the flow resistance of the underfill material UF and accelerate the flow speed of the underfill material UF when the underfill material UF passes through the separation region 140C.

Since the guiding patterns 144 provide sufficient capillary guiding force for the underfill material UF, the underfill material UF can flow from the high-density areas HD1 to the high-density areas HD2 with low flow resistance. Accordingly, the flow front as well as the flowing path of the underfill material UF can be well controlled, and the encysted void issue of the underfill material UF can be solved easily.

Figure 6:
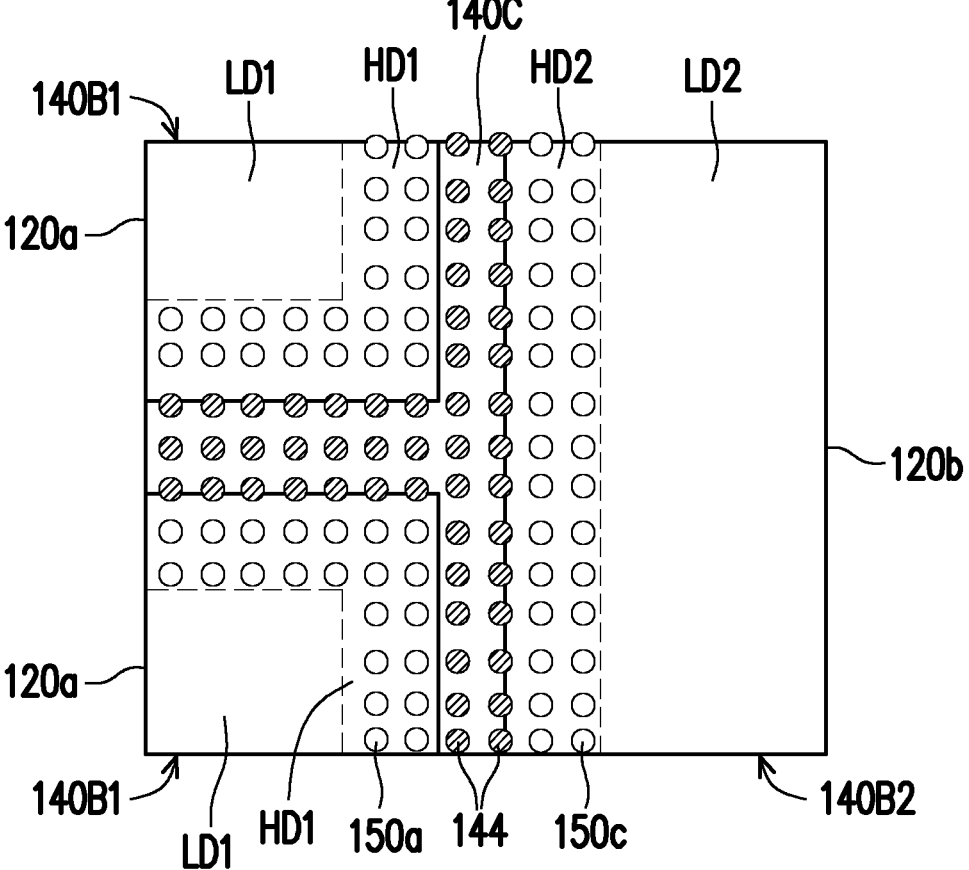
FIG. 6 schematically illustrates an enlarged top view of the guiding patterns in accordance with some embodiments of the present disclosure.

FIG. 6 schematically illustrates an enlarged top view of the guiding patterns in accordance with some embodiments of the present disclosure.

Referring to FIG. 6, in the present embodiment, the separation region 140C is a T-shaped separation region, the guiding patterns 144 include dot-shaped patterns distributed between the die bonding regions 140B1 and 140B2. In some embodiments, the dot-shaped guiding patterns 144 may be distributed evenly within the T-shaped separation region 140C, and the arrangement pitch of the dot-shaped guiding patterns 144 may be constant. In some alternative embodiments, the dot-shaped guiding patterns 144 may be merely distributed around the T-junction area of the T-shaped separation region 140C, and the arrangement pitch of the dot-shaped guiding patterns 144 may be constant. Furthermore, the dot-shaped guiding patterns 144 may be or include circular shaped guiding patterns, oval shaped guiding patterns, triangular shaped guiding patterns, rectangular shaped guiding patterns, combinations thereof, or other suitable shaped dot patterns.

As illustrated in FIG. 6, in some embodiments, the lateral dimension of the dot-shaped guiding patterns 144 may be greater than the lateral dimension of the pads (e.g., the conductive pads covered by the conductive terminals 150a) distributed in the high-density areas HD1. In some alternative embodiments, not shown in figures, the lateral dimension of the dot-shaped guiding patterns 144 may be substantially equal to the lateral dimension of the pads (e.g., the conductive pads covered by the conductive terminals 150a) distributed in the high-density areas HD1. Similarly, in some embodiments, the lateral dimension of the dot-shaped guiding patterns 144 may be greater than the lateral dimension of the pads (e.g., the conductive pads covered by the conductive terminals 150c) distributed in the high-density area HD2. In some alternative embodiments, not shown in figures, the lateral dimension of the dot-shaped guiding patterns 144 may be substantially equal to the lateral dimension of the pads (e.g., the conductive pads covered by the conductive terminals 150c) distributed in the high-density area HD2.

To provide sufficient capillary guiding force between the high-density areas HD1 and the high-density area HD2, the arrangement pitch of the dot-shaped guiding patterns 144 may range from about 10 micrometers to about 40 micrometers, and the lateral dimension of the dot-shaped guiding patterns 144 may range from about 6 micrometers to about 20 micrometers.

Figure 7A:
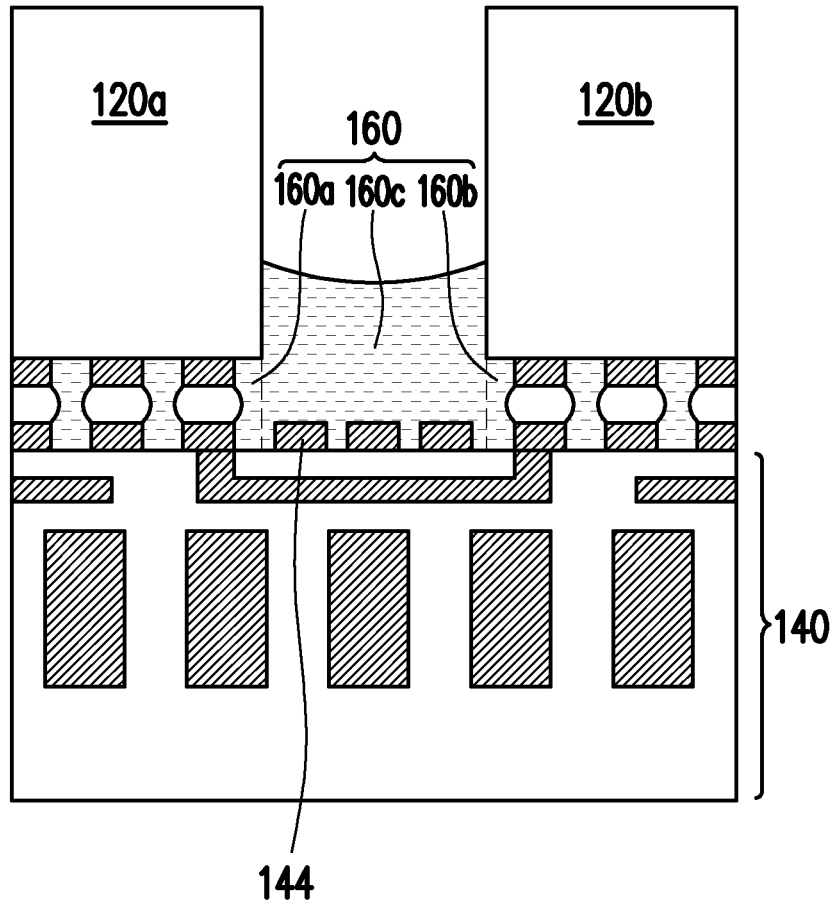
FIG. 7A and FIG. 7B schematically illustrate cross-sectional views of the guiding patterns illustrated in FIG. 6.
Figure 7B:
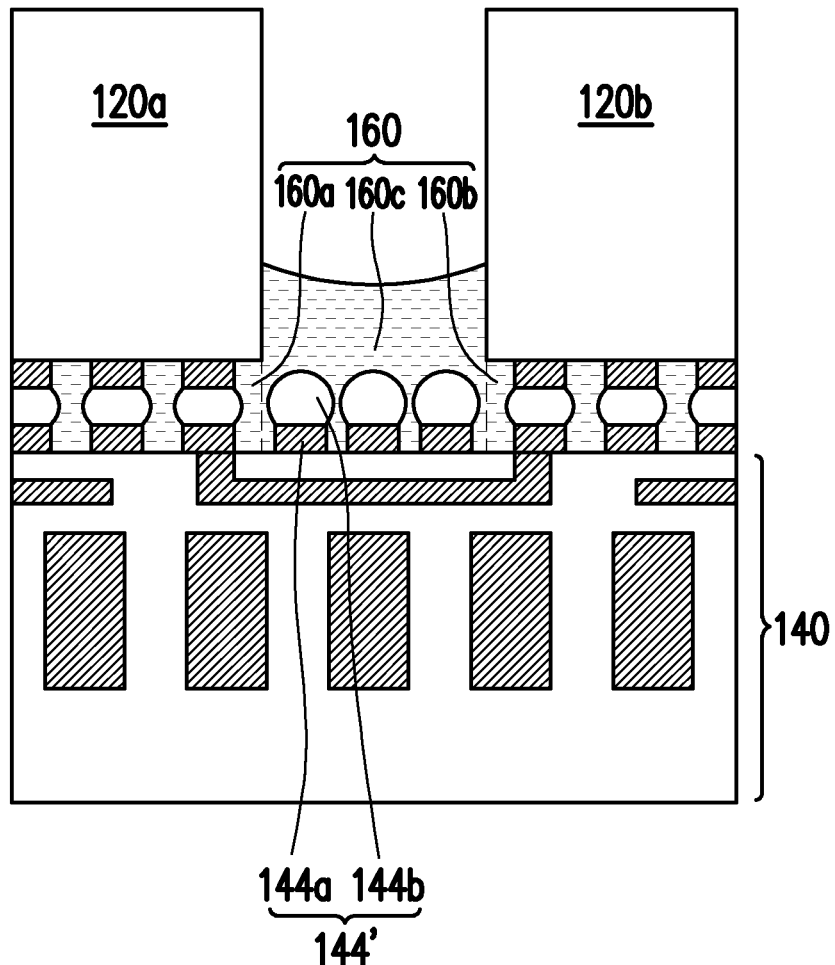

FIG. 7A and FIG. 7B schematically illustrate cross-sectional views of the guiding patterns illustrated in FIG. 6.

Referring to FIG. 1 and FIG. 7A, the guiding patterns 144 are covered by the dielectric layer 160. As illustrated in FIG. 1 and FIG. 7A, the dielectric layer 160 includes a first portion 160a, a second portion 160b and a connecting portion 160c between the first portion 160a and the second portion 160b. The first portion 160a of the dielectric layer 160 is covered by the first semiconductor die 120a and is disposed between the first semiconductor die 120a and the wiring substrate 140, the second portion 160b of the dielectric layer 160 is covered by the second semiconductor die 120b and is disposed between the second semiconductor die 120b and the wiring substrate 140, and the connecting portion 160c of the dielectric layer 160 covers and is in contact with the guiding patterns 144. In some embodiments, the guiding patterns 144 are spaced apart from the first semiconductor die 120a and the second semiconductor die 120b by the dielectric layer 160. In some embodiments, the connecting portion 160c of the dielectric layer 160 is thicker than the first portion 160a and the second portion 160b of the dielectric layer 160.

As illustrated in FIG. 7A, due to the capillarity, the connecting portion 160c of the dielectric layer 160 may have a recessed top surface. The connecting portion 160c of the dielectric layer 160 may cover sidewalls of the first semiconductor die 120a and the second semiconductor die 120b. Upper portions of the sidewalls of the first semiconductor die 120a and the second semiconductor die 120b are not laterally encapsulated by the connecting portion 160c of the dielectric layer 160. Furthermore, the connecting portion 160c of the dielectric layer 160 is covered by and in physical contact with the subsequently formed insulating encapsulation 130 (shown in FIG. 1).

Referring to FIG. 7B, the guiding patterns 144' shown in FIG. 7B are similar to the guiding patterns 144 shown in FIG. 7A except that each guiding pattern among the guiding patterns 144' includes a conductive pattern 144a and a solder material 144b, the conductive pattern 144a is disposed on the top surface of the wiring substrate 140, and the solder material 144b covers the conductive pattern 144a. The conductive pattern 144a of the guiding pattern 144' may be or include a circular shaped guiding pattern, an oval shaped guiding pattern, a triangular shaped guiding pattern, a rectangular shaped guiding pattern, or other suitable shaped dot pattern. Furthermore, the solder material 144b of the guiding pattern 144' may be or include a circular shaped solder cap, an oval shaped solder cap, a triangular shaped solder cap, a rectangular shaped solder cap, or other suitable types of solder cap.

As illustrated in FIG. 7B, the connecting portion 160c of the dielectric layer 160 covers and is in physical contact with the conductive pattern 144a and the solder material 144b.

Figure 8:
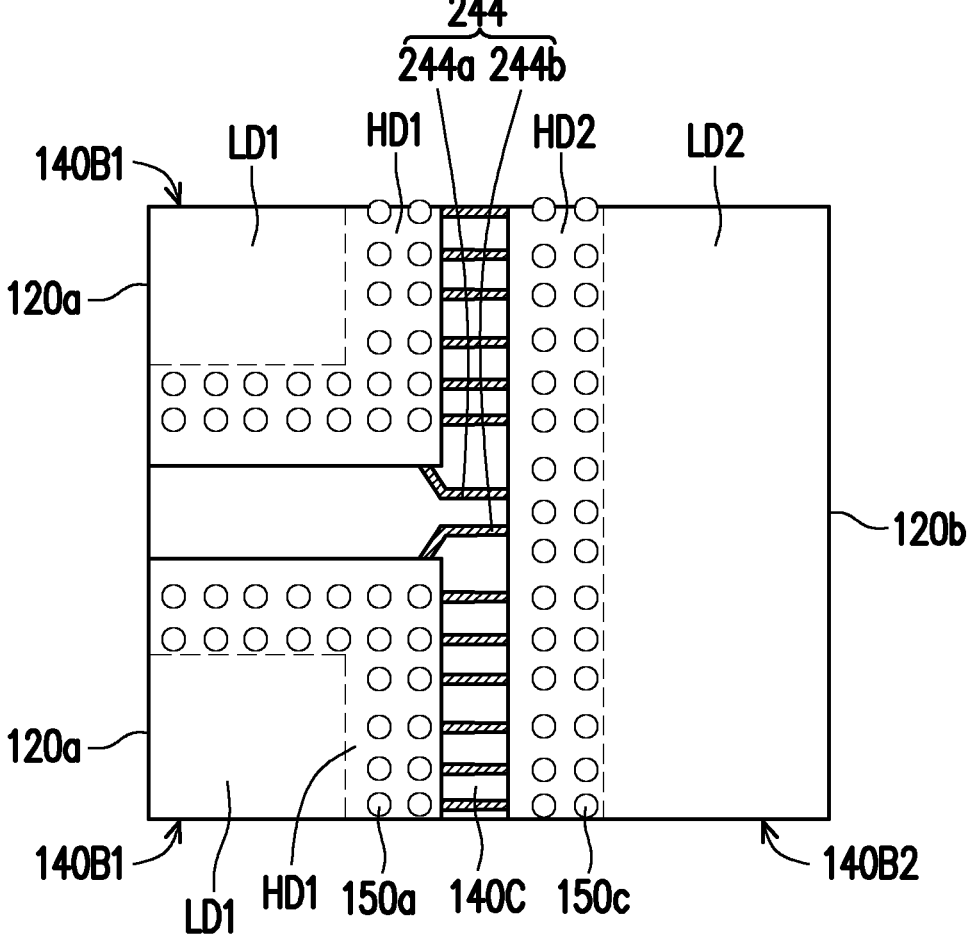
FIG. 8 schematically illustrates an enlarged top view of the guiding patterns in accordance with some embodiments of the present disclosure.

FIG. 8 schematically illustrates an enlarged top view of the guiding patterns in accordance with some embodiments of the present disclosure.

Referring to FIG. 8, the guiding patterns 244 shown in FIG. 8 provide similar function as the guiding patterns 144 shown in FIG. 7A except that the guiding patterns 244 includes strip-shaped patterns 244*a* and 244 extending across the separation region 140C. In the present embodiment, the guiding patterns 244 include at least one strip-shaped pattern 244*a* and at least one strip-shaped pattern 244*b*. The at least one strip-shaped pattern 244*a* extends from one of the first die bonding regions 140B1 to the second die bonding region 140B2, and the at least one strip-shaped pattern 244*b* extend from another one of the first die bonding regions 140B1 to the second die bonding region 140B2. Furthermore, a portion of the separation region 140C sandwiched between the adjacent high-density areas HD1 is not occupied by the guiding patterns 244. The guiding patterns 244 are mainly distributed over another portion of the separation region 140C that is sandwiched between the high-density areas HD1 and the high-density area HD2. In other words, the guiding patterns 244 are not evenly distributed over the separation region 140C. In some alternative embodiments, the guiding patterns 244 may be merely distributed around the T-junction area of the T-shaped separation region 140C.

Figure 9A:
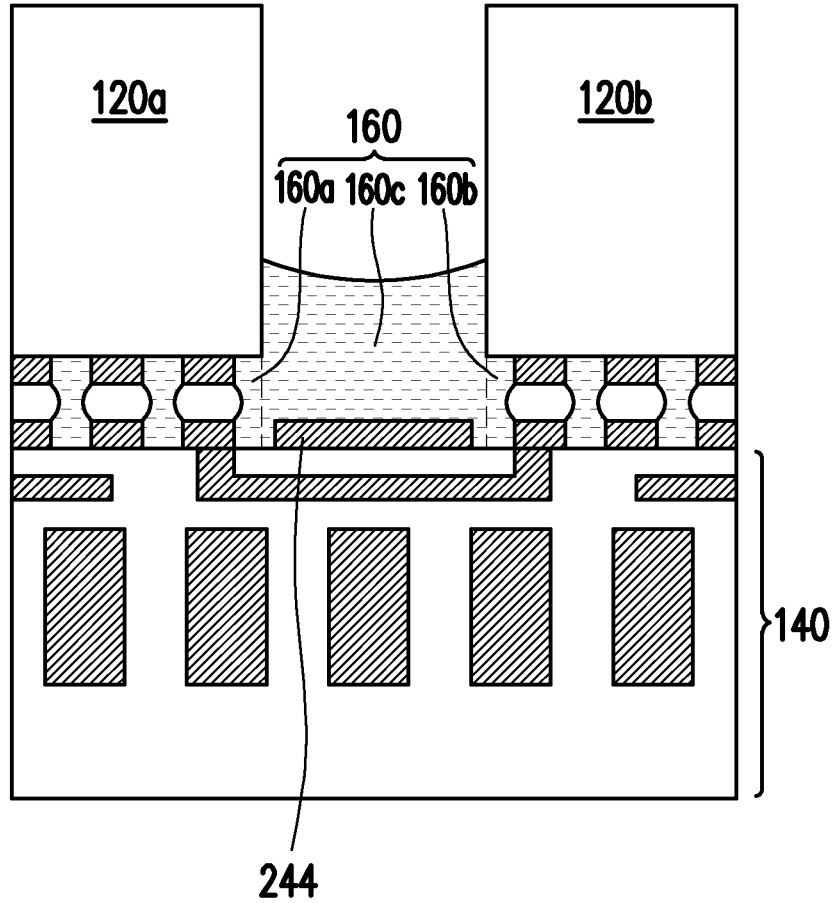
FIG. 9A and FIG. 9B schematically illustrate cross-sectional views of the guiding patterns illustrated in FIG. 8.
Figure 9B:
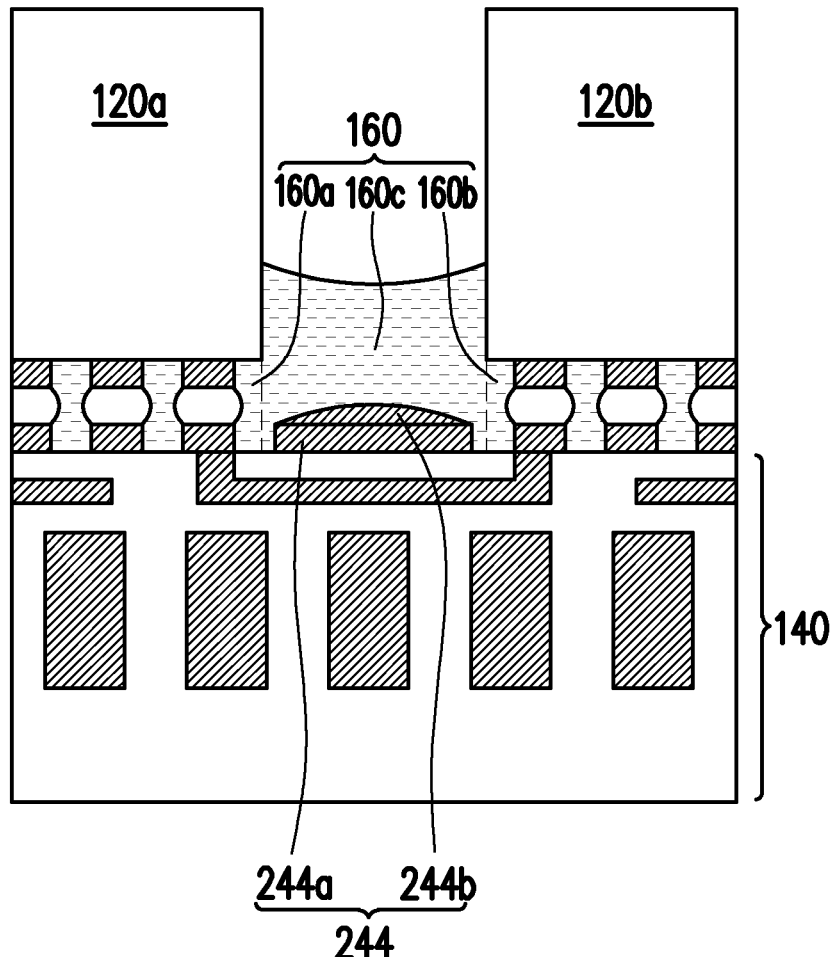

FIG. 9A and FIG. 9B schematically illustrate cross-sectional views of the guiding patterns illustrated in FIG. 8.

Referring to FIG. 1 and FIG. 9A, the guiding patterns 244 are covered by the dielectric layer 160. As illustrated in FIG. 1 and FIG. 9A, the dielectric layer 160 includes a first portion 160*a*, a second portion 160*b* and a connecting portion 160*c* between the first portion 160*a* and the second portion 160*b*. The first portion 160*a* of the dielectric layer 160 is covered by the first semiconductor die 120*a* and is disposed between the first semiconductor die 120*a* and the wiring substrate 140, the second portion 160*b* of the dielectric layer 160 is covered by the second semiconductor die 120*b* and is disposed between the second semiconductor die 120*b* and the wiring substrate 140, and the connecting portion 160*c* of the dielectric layer 160 covers and is in contact with the guiding patterns 244. In some embodiments, the guiding patterns 244 are spaced apart from the first semiconductor die 120*a* and the second semiconductor die 120*b* by the dielectric layer 160. In some embodiments, the connecting portion 160*c* of the dielectric layer 160 is thicker than the first portion 160*a* and the second portion 160*b* of the dielectric layer 160.

As illustrated in FIG. 9A, due to the capillarity, the connecting portion 160*c* of the dielectric layer 160 may have a recessed top surface. The connecting portion 160*c* of the dielectric layer 160 may cover sidewalls of the first semiconductor die 120*a* and the second semiconductor die 120*b*. Upper portions of the sidewalls of the first semiconductor die 120*a* and the second semiconductor die 120*b* are not laterally encapsulated by the connecting portion 160*c* of the dielectric layer 160. Furthermore, the connecting portion 160*c* of the dielectric layer 160 is covered by and in physical contact with the subsequently formed insulating encapsulation 130 (shown in FIG. 1).

Referring to FIG. 9B, the guiding patterns 244' shown in FIG. 9B are similar to the guiding patterns 244 shown in FIG. 9A except that each guiding pattern among the guiding patterns 244' includes a conductive pattern 244*a* and a solder material 244*b*, the conductive pattern 244*a* is disposed on the top surface of the wiring substrate 140, and the solder material 244*b* covers the conductive pattern 244*a*. The conductive pattern 244*a* of the guiding pattern 244' may be or include a circular shaped guiding pattern, an oval shaped guiding pattern, a triangular shaped guiding pattern, a rectangular shaped guiding pattern, or other suitable shaped dot pattern. Furthermore, the solder material 244*b* of the guiding pattern 244' may be or include a circular shaped solder cap, an oval shaped solder cap, a triangular shaped solder cap, a rectangular shaped solder cap, or other suitable types of solder cap.

As illustrated in FIG. 9B, the connecting portion 160*c* of the dielectric layer 160 covers and is in physical contact with the conductive pattern 244*a* and the solder material 244*b*.

Figure 10:
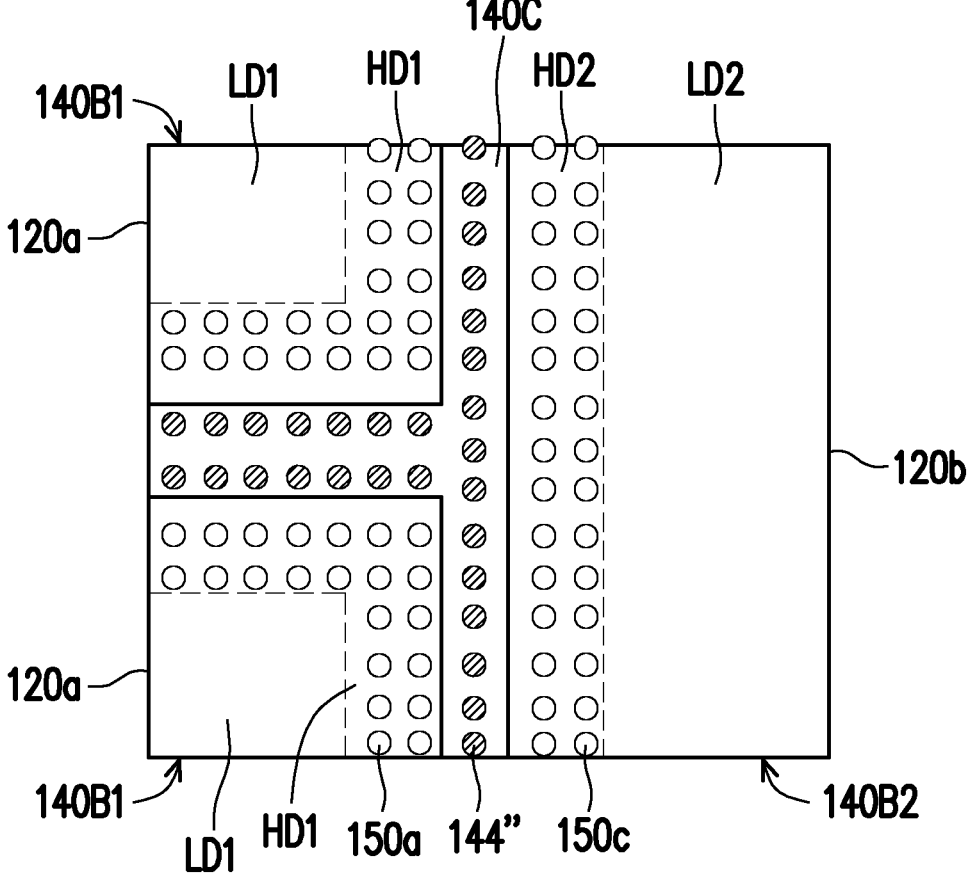
FIG. 10 through FIG. 12 schematically illustrate enlarged top views of the guiding patterns in accordance with some alternative embodiments of the present disclosure.
Figure 11:
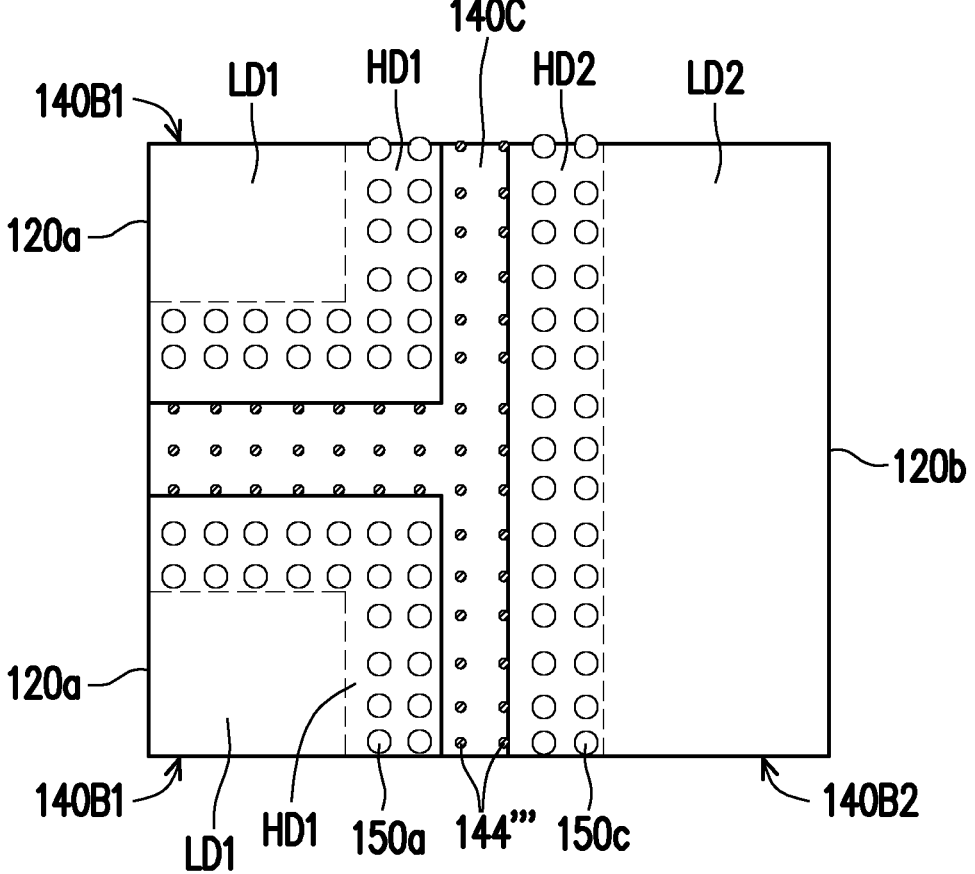
Figure 12:
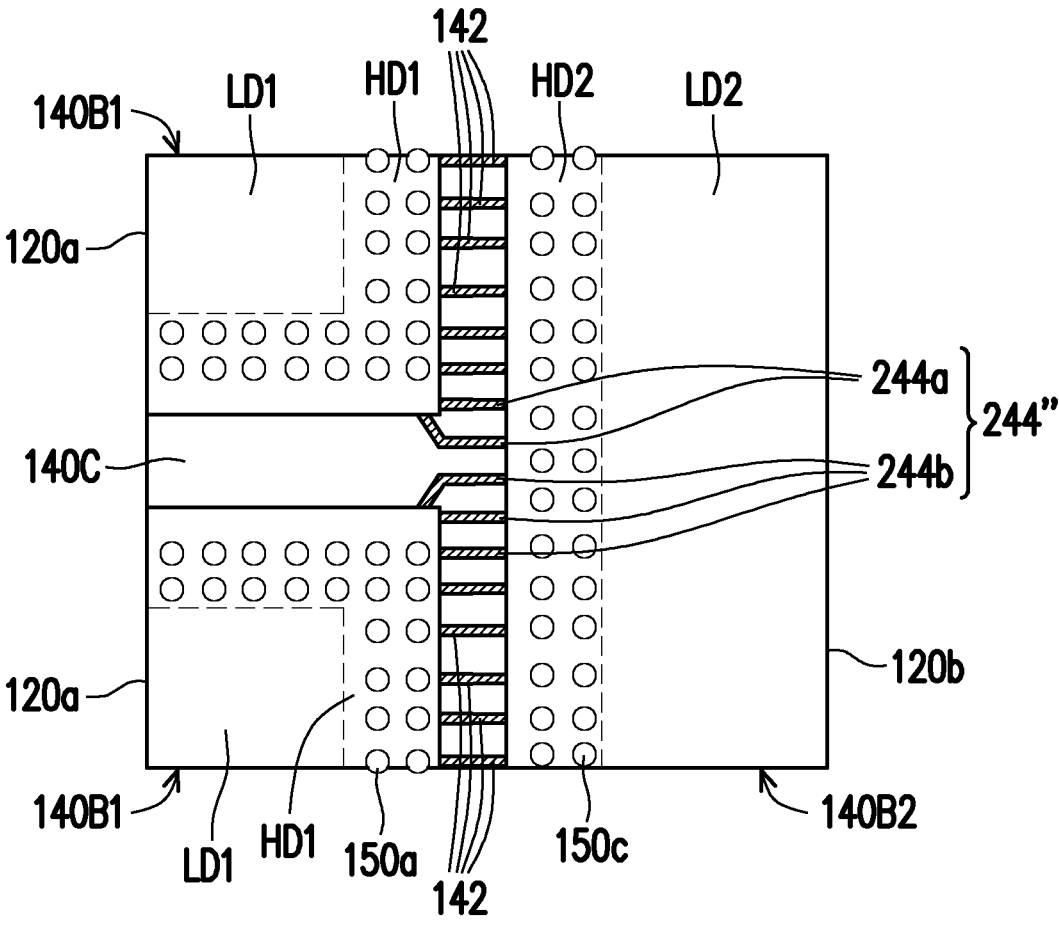

FIG. 10 through FIG. 12 schematically illustrate enlarged top views of the guiding patterns in accordance with some alternative embodiments of the present disclosure.

Referring to FIG. 6 and FIG. 10, the guiding patterns 144''' shown in FIG. 10 are similar to the guiding patterns 144 shown in FIG. 6 except that the distribution density and the quantity of the guiding patterns 144'' are less than those of the guiding patterns 144.

Referring to FIG. 6 and FIG. 11, the guiding patterns 144''' shown in FIG. 11 are similar to the guiding patterns 144 shown in FIG. 6 except that the lateral dimension of each dot shaped guiding pattern among the guiding patterns 144''' is reduced. The lateral dimension of the dot-shaped guiding pattern 144''' is less than the lateral dimension of the pads (e.g., the conductive pads covered by the conductive terminals 150*a*) distributed in the high-density areas HD1. Similarly, in some embodiments, the lateral dimension of the dot-shaped guiding pattern 144''' is less than the lateral dimension of the pads (e.g., the conductive pads covered by the conductive terminals 150*c*) distributed in the high-density area HD2.

Referring to FIG. 8 and FIG. 12, the guiding patterns 244'' shown in FIG. 12 are similar to the guiding patterns 244 shown in FIG. 6 except that the guiding patterns 244'' are merely distributed around the T-junction area of the T-shaped separation region 140C. Furthermore, some of the conductive wirings 142 may extend across the separation region 140C. For example, the conductive wirings 142 are distributed at opposite sides (e.g., the upper side and the lower side) of the guiding patterns 244''.

In the above-mentioned embodiments, various designs of the guiding patterns are provided in-between adjacent semiconductor dies such that the flow front and the flowing path of the underfill material applied between the semiconductor dies and the interposer wiring substrate can be effectively controlled. Accordingly, possibility of encysted voids occurred in the flowable underfill material can be minimized.

In accordance with some embodiments of the disclosure, a package structure including a wiring substrate, semiconductor dies, and a dielectric layer is provided. The wiring substrate includes die bonding regions and guiding patterns distributed between the die bonding regions. The semiconductor dies are disposed on the die bonding regions and electrically connected to the wiring substrate, wherein the guiding patterns are electrically insulated from the semiconductor dies. The dielectric layer is disposed between the semiconductor dies and the wiring substrate, wherein the dielectric layer covers and is in contact with the guiding patterns. In some embodiments, the guiding patterns are electrically floating. In some embodiments, the guiding patterns are electrically insulated from conductive wirings of the wiring substrate, and the conductive wirings of the wiring substrate are electrically connected to the semiconductor dies. In some embodiments, the guiding patterns include strip-shaped patterns extending from a first die bonding region among the die bonding regions to a second die bonding region among the die bonding regions. In some embodiments, the guiding patterns include dot-shaped patterns distributed between the die bonding regions. In some embodiments, the guiding patterns each includes a conductive pattern and a solder material, the conductive pattern is disposed on the wiring substrate, and the solder material covers the conductive pattern. In some embodiments, the guiding patterns are spaced apart from the semiconductor dies by the dielectric layer. In some embodiments, the package structure further includes an insulating encapsulation disposed on the wiring substrate, the insulating encapsulation laterally encapsulates the semiconductor dies.

In accordance with some other embodiments of the disclosure, a package structure including a wiring substrate, a first semiconductor die, and a dielectric layer is provided. The wiring substrate includes bonding regions, the die bonding regions are laterally spaced apart from each other by a separation region. The wiring substrate further includes auxiliary patterns distributed in the separation region. The first semiconductor die is disposed on a first die bonding region among the die bonding regions and electrically connected to the wiring substrate. The first semiconductor die includes a first group of conductive terminals and a second group of conductive terminals, wherein a first arrangement pitch of the first group of conductive terminals is greater than a second arrangement pitch of the second group of conductive terminals. The auxiliary patterns are electrically insulated from the first group of conductive terminals, the second group of conductive terminals, the third group of conductive terminals, and the fourth group of conductive terminals. The dielectric layer is disposed a first gap between the first semiconductor die and the wiring substrate as well as a second gap between the second semiconductor die and the wiring substrate. The dielectric layer covers and is in contact with the auxiliary patterns. In some embodiments, the package structure further includes a second semiconductor die disposed on a second die bonding region among the die bonding regions and electrically connected to the wiring substrate, wherein the second semiconductor die includes a third group of conductive terminals and a fourth group of conductive terminals, a third arrangement pitch of the third group of conductive terminals is greater than a fourth arrangement pitch of the fourth group of conductive terminals. In some embodiments, the auxiliary patterns are electrically floating. In some embodiments, the auxiliary patterns are electrically insulated from the semiconductor dies. In some embodiments, the auxiliary patterns include strip-shaped patterns extending across the separation region. In some embodiments, the auxiliary patterns include dot-shaped patterns distributed in the separation region. In some embodiments, the auxiliary patterns each includes a conductive pattern and a solder material, the conductive pattern is disposed on the wiring substrate, and the solder material covers the conductive pattern. In some embodiments, the first group of conductive terminals are laterally disposed between the auxiliary patterns and the second group of conductive terminals, and the third group of conductive terminals are laterally disposed between the auxiliary patterns and the fourth group of conductive terminals.

In accordance with some other embodiments of the disclosure, a package structure including a wiring substrate, a first semiconductor die, a second semiconductor die, and a dielectric layer is provided. The wiring substrate includes conductive wirings and dummy patterns, wherein the dummy patterns are distributed on a surface of the wiring substrate and are electrically floating. The first semiconductor die is disposed on the surface of the wiring substrate and electrically connected to the conductive wirings of the wiring substrate. The second semiconductor die is disposed on the surface of the wiring substrate and electrically connected to the conductive wirings of the wiring substrate. The dielectric layer includes a first portion, a second portion and a connecting portion between the first portion and the second portion. The first portion is disposed between the first semiconductor die and the wiring substrate, the second portion is disposed between the second semiconductor die and the wiring substrate, and the connecting portion of the dielectric layer covers and is in contact with the dummy patterns. In some embodiments, the dummy patterns are spaced apart from the semiconductor die by the dielectric layer. In some embodiments, the connecting portion is thicker than the first portion and the second portion. In some embodiments, the package structure further includes first conductive terminals and second conductive terminals, wherein the first semiconductor die is electrically connected to the conductive wirings of the wiring substrate through the first conductive terminals, and the second semiconductor die is electrically connected to the conductive wirings of the wiring substrate through the second conductive terminals. In some embodiments, the dummy patterns each includes a conductive pattern and a solder material, the conductive pattern is disposed on the wiring substrate, and the solder material covers the conductive pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a wiring substrate comprising die bonding regions and guiding patterns distributed between the die bonding regions;
   semiconductor dies disposed on the die bonding regions and electrically connected to the wiring substrate, wherein the guiding patterns are electrically insulated from the semiconductor dies; and
   a dielectric layer between the semiconductor dies and the wiring substrate, wherein the dielectric layer covers and is in contact with the guiding patterns, wherein a minimum distance between the bonding regions and the semiconductor dies is greater than a thickness of the guiding patterns.

2. The package structure of claim 1, wherein the guiding patterns are electrically floating.

3. The package structure of claim 1, wherein the guiding patterns are electrically insulated from conductive wirings of the wiring substrate, and the conductive wirings of the wiring substrate are electrically connected to the semiconductor dies.

4. The package structure of claim 1, wherein the guiding patterns comprise strip-shaped patterns extending from a first die bonding region among the die bonding regions to a second die bonding region among the die bonding regions.

5. The package structure of claim 1, wherein the guiding patterns comprise dot-shaped patterns distributed between the die bonding regions.

6. The package structure of claim 1, wherein the guiding patterns each comprises a conductive pattern and a solder material, the conductive pattern is disposed on the wiring substrate, and the solder material covers the conductive pattern.

7. The package structure of claim 1, wherein the dielectric layer comprises an underfill, and the guiding patterns are spaced apart from the semiconductor dies by the underfill.

8. The package structure of claim 1 further comprising:
an insulating encapsulation disposed on the wiring substrate and laterally encapsulating the semiconductor dies.

9. A package structure, comprising:
a wiring substrate comprising bonding regions, the die bonding regions being laterally spaced apart from each other by a separation region, wherein the wiring substrate further comprising auxiliary patterns distributed in the separation region;
a first semiconductor die disposed on a first die bonding region among the die bonding regions and electrically connected to the wiring substrate, the first semiconductor die comprising a first group of conductive terminals and a second group of conductive terminals, and a first arrangement pitch of the first group of conductive terminals being greater than a second arrangement pitch of the second group of conductive terminals, wherein a height of the first group of conductive terminals is greater than a thickness of the auxiliary patterns; and
a dielectric layer disposed between the first semiconductor die and the wiring substrate, wherein the dielectric layer covers and is in contact with the auxiliary patterns.

10. The package structure of claim 9 further comprising:
a second semiconductor die disposed on a second die bonding region among the die bonding regions and electrically connected to the wiring substrate, the second semiconductor die comprising a third group of conductive terminals and a fourth group of conductive terminals, a third arrangement pitch of the third group of conductive terminals being greater than a fourth arrangement pitch of the fourth group of conductive terminals, wherein the auxiliary patterns are electrically insulated from the first group of conductive terminals, the second group of conductive terminals, the third group of conductive terminals, and the fourth group of conductive terminals, and
the dielectric layer is further disposed between the second semiconductor die and the wiring substrate.

11. The package structure of claim 9, wherein the auxiliary patterns are electrically floating or electrically insulated from the semiconductor dies.

12. The package structure of claim 9, wherein the auxiliary patterns comprise strip-shaped patterns extending across the separation region.

13. The package structure of claim 9, wherein the auxiliary patterns comprise dot-shaped patterns distributed in the separation region.

14. The package structure of claim 9, wherein the auxiliary patterns each comprises a conductive pattern and a solder material, the conductive pattern is disposed on the wiring substrate, and the solder material covers the conductive pattern.

15. The package structure of claim 9, wherein the first group of conductive terminals are laterally disposed between the auxiliary patterns and the second group of conductive terminals, and the third group of conductive terminals are laterally disposed between the auxiliary patterns and the fourth group of conductive terminals.

16. A package structure, comprising:
a wiring substrate comprising conductive wirings and dummy patterns, wherein the dummy patterns are distributed on a surface of the wiring substrate and are electrically floating;
a first semiconductor die disposed on the surface of the wiring substrate and electrically connected to the conductive wirings of the wiring substrate, wherein a height of the dummy patterns is less than a standoff distance between the first semiconductor die and the surface of the wiring substrate;
a second semiconductor die disposed on the surface of the wiring substrate and electrically connected to the conductive wirings of the wiring substrate; and
a dielectric layer comprising a first portion, a second portion and a connecting portion between the first portion and the second portion, wherein the first portion is disposed between the first semiconductor die and the wiring substrate, the second portion is disposed between the second semiconductor die and the wiring substrate, the connecting portion of the dielectric layer covers and is in contact with the dummy patterns.

17. The package structure of claim 16, wherein the dielectric layer comprises an underfill, and the dummy patterns are spaced apart from the semiconductor die by the underfill.

18. The package structure of claim 16, wherein the connecting portion is thicker than the first portion and the second portion.

19. The package structure of claim 16 further comprising:
first conductive terminals, wherein the first semiconductor die is electrically connected to the conductive wirings of the wiring substrate through the first conductive terminals; and
second conductive terminals, wherein the second semiconductor die is electrically connected to the conductive wirings of the wiring substrate through the second conductive terminals.

20. The package structure of claim 16, wherein the dummy patterns each comprises a conductive pattern and a solder material, the conductive pattern is disposed on the wiring substrate, and the solder material covers the conductive pattern.

* * * * *